United States Patent [19]

Onishi et al.

[11] 4,412,351
[45] Oct. 25, 1983

[54] MICROWAVE MIXING CIRCUIT

[75] Inventors: Hiroshi Onishi; Sadahiko Yamashita; Mitsuo Makimoto, all of Kawasaki, Japan

[73] Assignee: Matsushita Electric Industrial Co., Ltd., Osaka, Japan

[21] Appl. No.: 314,501

[22] Filed: Oct. 23, 1981

Related U.S. Application Data

[63] Continuation of Ser. No. 43,003, May 29, 1979, abandoned.

[30] Foreign Application Priority Data

May 30, 1978 [JP] Japan .................... 53-65205

[51] Int. Cl.$^3$ ............................................. H04B 1/26
[52] U.S. Cl. .................... 455/317; 455/327; 333/176
[58] Field of Search ............... 455/317, 323, 325, 326, 455/327, 328, 330, 302; 333/175, 176, 239, 248; 331/42, 43, 77, 107 P

[56] References Cited

U.S. PATENT DOCUMENTS

| 3,310,748 | 3/1967 | Putnam | 455/327 |
| 3,611,153 | 10/1973 | Wen | 455/327 |
| 3,939,430 | 2/1976 | Dickens | 455/302 |
| 4,211,977 | 7/1980 | Shinkawa | 455/326 |

FOREIGN PATENT DOCUMENTS

| 52-98409 | 8/1977 | Japan | 455/327 |
| 52-98410 | 8/1977 | Japan | 455/327 |
| 52-98411 | 8/1977 | Japan | 455/327 |
| 52-98412 | 8/1977 | Japan | 455/327 |
| 593298 | 2/1978 | U.S.S.R. | 455/325 |

OTHER PUBLICATIONS

Empfanger fur das 12 GHZ-Fernsehen, Rundfunktechn Mitteilugnen Band 15 (1971) H.,4, 8/3/71, by Von Martin Lemke et al., pp. 163-166.
A 20-MHZ Integrated Balanced Mixer, by Tohru Araki et al., IEEE Transactions on Microwave Theory and Techniques, vol. MIT-19, No. 7 (Jul. 1971).

Primary Examiner—Tommy P. Chin
Attorney, Agent, or Firm—Lowe, King, Price & Becker

[57] ABSTRACT

A microwave mixing circuit comprises a main transmission line having an input port for receiving an input high frequency and an output port, a band pass filter responsive to a local oscillation frequency, first and second band stop filters, and a mixing diode connected to the output port. The local oscillation frequency applied via the band pass filter to the main transmission line is prevented from being transmitted toward the input port because of the first band stop filter, while an image frequency produced by the diode is reflected by the second band stop filter to be applied to the diode.

12 Claims, 9 Drawing Figures

MICROWAVE MIXING CIRCUIT

This is a continuation of application Ser. No. 043,003, filed May 29, 1979.

FIELD OF THE INVENTION

This invention generally relates to microwave mixing circuits. More particularly, the present invention relates to a microwave mixing circuit constructed of a microwave integrated circuit.

BACKGROUND OF THE INVENTION

Most of the conventional microwave mixing circuits constructed of integrated circuits, employ two mixing diodes. However, because of requirement of two diodes, the cost of the conventional microwave mixing circuits is high, while it requires twice as much electric power for the local oscillation signal than in case of using a single diode.

As a countermeasure for the above-mentioned two-diode type microwave mixing circuits, several mixing circuits which require only a single diode are known. However, these known single-diode type microwave mixing circuits are not practical inasmuch as the amount of loss of the input high frequency is great and/or the amount of undesirable radiation of the local oscillation frequency is great.

SUMMARY OF THE INVENTION

The present invention has been developed in order to remove the above-mentioned disadvantages and drawbacks inherent to the conventional or known microwave mixing circuits.

It is, therefore, a primary object of the present invention to provide a single-diode type microwave mixing circuit which requires in which the loss of the input high frequency is negligible.

Another object of the present invention is to provide such a microwave mixing circuit in which undesirable radiation of the local oscillation frequency is prevented.

A further object of the present invention is to provide such a microwave mixing circuit which requires less power in the local oscillation frequency signal.

A still further object of the present invention is to provide such a microwave mixing circuit in which the power of the local oscillation frequency is effectively transmitted to a mixing diode.

A still further object of the present invention is to provide such a microwave mixing circuit in which an image signal is effectively utilized to raise the magnitude of an output intermediate frequency.

A yet further object of the present invention is to provide a low noise type microwave mixing circuit.

A still further object of the present invention is to provide such a microwave mixing circuit the construction of which is simple.

A still further object of the present invention is to provide a compact microwave mixing circuit.

According to the present invention there is provided a microwave mixing circuit constructed of a microwave integrated circuit, comprising: (a) a main transmission line having an input port for receiving an input high frequency, and an output port; (b) a band pass filter responsive to a local oscillation frequency, the band pass filter being electromagnetically coupled to the main transmission line at a point along the main transmission line; (c) a mixing diode connected to the output port for producing an intermediate frequency; (d) first means for blocking the local oscillation frequency, the first means being electromagnetically coupled to the main transmission line in such a manner that the impedance at the local oscillation frequency viewed from the point toward the input port is infinite; (e) second means for blocking an image frequency, which is produced in response to the input high frequency and a second harmonic frequency of the local oscillation frequency, the second means being electromagnetically coupled to the main transmission line in such a manner that the impedance at the image frequency viewed from the input of the mixing diode toward the point is either zero or infinite.

BRIEF DESCRIPTION OF THE DRAWINGS

These and other objects and features of the present invention will become more readily apparent from the following detailed description of the preferred embodiments taken in conjunction with the accompanying drawings in which.

DETAILED DESCRIPTION OF THE PREFERRED EMBODIMENTS

Prior to describing the preferred embodiments of the microwave mixing circuit according to the present invention, some conventional or known mixing circuits will be described hereinbelow for a better understanding of the objects of the present invention.

Figure 1:
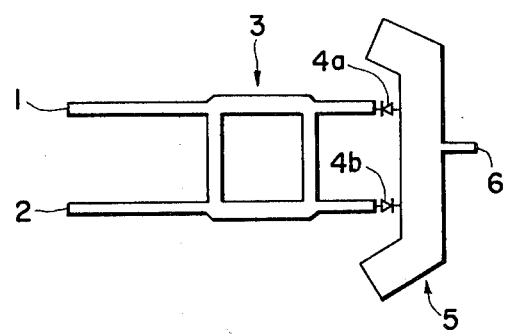
FIG. 1 shows a conventional two-diode type microwave mixing circuit.

Referring to FIG. 1 a widely used conventional two-diode balanced type microwave mixing circuit constructed of a microwave integrated circuit (MIC) is shown. An input high frequency signal is applied to a first input port 1 provided at one end of a stripline, while a local oscillation signal is applied to a second input port 2 provided at one end of another stripline which is equidistantly spaced from the above-mentioned one. These two striplines are connected to inputs of a directional coupler 3 at the other ends thereof so that the input high frequency and the local oscillation signal are applied to two diodes 4a and 4b connected to outputs of the directional coupler 3 the coupling coefficient of which is three decibells. The diodes 4a and 4b are connected to a low pass filter 5 so that an intermediate frequency produced by the diodes 4a and 4b is developed at the output 6 of the microwave mixing circuit.

The greatest defects of the above described conventional two-diode balanced type mixing circuit are that the cost is high inasmuch as the circuit requires two mixing diodes, and that the circuit requires twice as much electric power for the local oscillation signal than in case of using a single diode.

Figure 2:
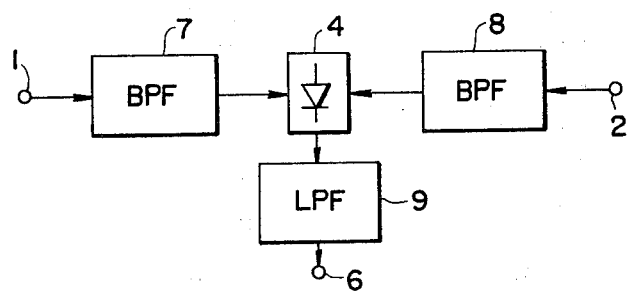
FIG. 2 shows a schematic block diagram of a conventional single-diode type microwave mixing circuit.

FIG. 2 illustrates a mixing circuit commonly used in waveguide type mixing circuits. The mixing circuit has a first input terminal which receives an input high frequency signal and a second input terminal 2 which receives a local oscillation signal. These two signals are respectively applied to first and second band pass filters 7 and 8 the output of which are respectively connected via single mixing diode 4 to an input of a low pass filter 9. An intermediate frequency signal is produced in the mixing diode 4 and this intermediate frequency signal is applied to the low pass filter which permits the transmission of the same. However, when the above described mixing circuit is constructed of elements, such as microwave striplines, the circuit Q of which is relatively low, the loss in the input high frequency signal is great due to the dielectric loss of the strip-lines. Accordingly, conversion loss increases and thus the noise characteristic which corresponds to the sensitivity is deteriorated.

Figure 3:
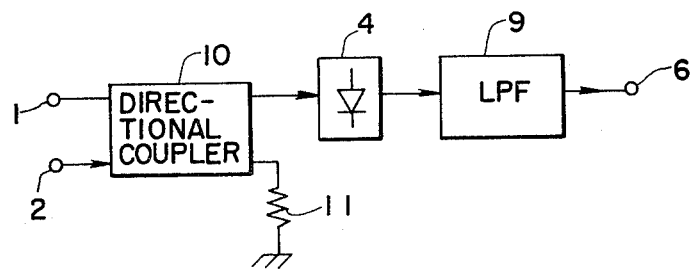
FIG. 3 shows a schematic block diagram of a conventional single-diode type microwave mixing circuit which includes a directional coupler.

FIG. 3 illustrates an example of a conventional mixing circuit which includes a directional coupler. For the purpose of reducing the loss in the input high frequency signal, a directional coupler 10 having a low coupling coefficient is used, while a dummy resistor 11 which functions as a reflectionless terminator is additionally employed in order to maintain the directivity of the directional coupler 10. The mixing circuit shown in FIG. 3 suffers from drawbacks that (1) it requires a reflectionless terminator, (2) the power loss of the input high frequency is relatively large since the power of the input high frequency is delivered to the terminating resistor, and (3) a high power in the local oscillation frequency is required since the coupling coefficient of the directional coupler cannot be set at a high value.

From the above, it will be understood that when it is intended to construct a single-diode (single-ended) type mixing circuit by way of a microwave integrated circuit, all of the following points have to be satisfied in order to obtain a microwave mixing circuit having a superior characteristic and of low cost:

(1) The number of mixing diodes should be one.

(2) The technique of mixing a local oscillation frequency with an input high frequency has to be selected such that the amount of loss in the power of the input high frequency is maintained as low as possible for improving the noise characteristic (sensitivity).

(3) In order to efficiently utilize the power of the local oscillation frequency the power of the local oscillation frequency signal has to be efficiently applied to the mixing diode.

(4) An undesirable radiation of the local oscillation signal from the high frequency input terminal of a mixing circuit has to be reduced as much as possible.

(5) An image frequency signal has to be suppressed, while the image frequency signal is utilized to improve the noise characteristic (sensitivity) of the mixing circuit.

(6) The mixing circuit has to be simple in construction.

According to the conventional mixing circuits, at least one of the above described requirements is satisfied. However, none of the conventional or known mixing circuits satisfy all of the requirements concurrently. The present invention which will be described hereinafter will fulfill all of the requirements above listed.

Figure 4:
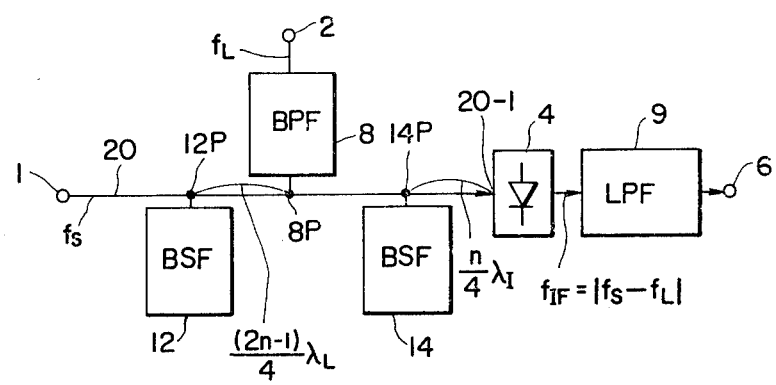
FIG. 4 shows a schematic block diagram of a first embodiment of the microwave mixing circuit according to the present invention.

Reference is now made to FIG. 4 which shows a schematic block diagram of a first embodiment of the microwave mixing circuit according to the present invention. The mixing circuit comprises a main transmission line 20 having an input port which functions as a first input terminal 1 of the mixing circuit for receiving an input high frequency signal $f_S$, and an output port 20-1 connected via mixing diode to an input of a low pass filter 9. The output of the low pass filter 9 is connected to an output terminal 6 of the mixing circuit. A band pass filter (BPF) 8 is provided to receive a local oscillation frequency $f_L$ at a second input terminal 2 of the mixing circuit. The output of the band pass filter 8 is coupled to the main transmission line 20 at a first point 8P thereon. First and second band stop filters (BSF) 12 and 14, which are sometimes called band-rejection filters, are respectively coupled to the main transmission line 20 at second and third points 12P and 14P. Although in the above, it has been described that the band pass filter 8 and the first and second band stop filters 12 and 14 are respectively coupled to the main transmission line 20, these circuits are not physically connected to the main transmission line 20 but are electromagnetically coupled thereto as will be further described hereinlater and shown in drawings.

The band pass filter 8 has a frequency characteristic of passing only a frequency band the center frequency of which is the local oscillation frequency $f_L$ so that the input high frequency $f_S$ applied to the first input terminal 1 is prevented from being transmitted in a direction to the second input terminal 2. The first band stop filter 12 has a resonance frequency corresponding to the local oscillation frequency $f_L$ so that the local oscillation frequency $f_L$ applied from the second input terminal 2 via the band pass filter 8 to the main transmission line 20 is prevented from being transmitted toward the first input terminal 1 beyond the point 8P. It is to be noted that the second point 12P at which the first band stop filter 12 is coupled to the main transmission line 20 is located between the first input terminal 1 and the first point 8P. The second band stop filter 14 has a resonance frequency corresponding to the image frequency which is expressed in terms of $f_I=(2f_L-f_S)$, and is generated by the mixing diode 4. Because of this second band stop filter 14 the image frequency $f_I$ generated by the mixing diode 4 is prevented from being transmitted in a direction to the first point 8P along the main transmission line 20.

Above described functions of the first and second band stop filters 12 and 14 will be obtained only when these band stop filters 12 and 14 are located at predetermined positions as will be described hereinbelow. In other words the distance between the first point 8P and the second point 12P and the other distance between the third point 14P and the output port 20-1 of the main transmission line 20 have to be respectively determined in such a manner that these first and second band stop filters 12 and 14 operate properly.

The distance between the first and second points 8P and 12P is so determined that the impedance at the local oscillation frequency $f_L$ viewed from the first point 8P toward the input side is infinite (of open-circuit), while the distance between the third point 14P and the output port 20-1 is so determined that the impedance at the image frequency $f_I$ viewed from the output port 20-1 toward the first point 8P is either zero (of closed-circuit) or infinite. With these arrangements, the local oscillation frequency $f_L$ applied to the main transmission line 20 from the second input terminal 2 is reflected at the first point 8P so that most of the power of the local oscillation frequency $f_L$ is transmitted along the main transmission line 20 in a direction from the first point 8P to the output port 20-1, while the image frequency $f_I$ generated by the mixing diode 4 is reflected at the output port 20-1 of the main transmission line 20 so that the image frequency $f_I$ is effectively used to increase the magnitude of an intermediate frequency $f_{IF}$ which will be developed at the output of the mixing diode 4.

The first embodiment mixing circuit shown in FIG. 4 operates as follows: An input high frequency $f_S$ applied to the first input terminal 1 is transmitted via the main transmission line 20 to the input of the mixing diode 4, while a local oscillation frequency $f_L$, which is either higher or lower than the input high frequency $f_S$ and is applied to the second input terminal 2, is also applied via the band pass filter 8 and a portion of the transmission line 20, which portion is defined by the first point 8P and the output port 20-1, to the same input of the mixing diode 4. At this time most of the power of the local oscillation frequency $f_L$ is transmitted to the mixing diode 4 because of the first band stop filter 12. The mixing diode 4 generates an intermediate frequency $f_{IF} = |f_S - f_L|$ in response to the above-mentioned two input signals $f_S$ and $f_L$, while the image frequency generated by the mixing diode 4 is used by the same to generate a signal corresponding to the intermediate frequency $f_{IF}$ inasmuch as the image frequency is prevented from being transmitted along the main transmission line 20 toward the first point 8P and then this image frequency $f_I$ is mixed with the local oscillation signal $f_L$. In other words, the image frequency $f_I$ generated by the mixing diode 4 is reflected by the second band stop filter 14 at the output port 20-1 of the main transmission line 20. As a result the intensity or magnitude of the intermediate frequency $f_{IF}$ derived from the output of the mixing diode 4 is raised compared to a case of no reflection of the image frequency $f_I$. This operation of raising the amplitude of intermediate frequency is called an image frequency recovery effect. It is to be noted that the intermediate frequency drawn from the output of the mixing diode 4 is the sum of two signals which are respectively produced via two different ways, i.e. $f_{IF} = |f_S - f_L|$ and $f_{IF} = |f_L - (2f_L - f_S)| = |f_S - f_L|$. These two signals have to be in-phase to be added to each other properly so that the impedance at the image frequency $f_I$ viewed from the output port 20-1 toward the first point 8P has to be set at a given value as will be described hereinlater.

Since the first input terminal 1 is directly connected via the main transmission line 20 to the input of the mixing diode 4, the losses that the input high frequency $f_S$ suffers are only those caused by the first and second band stop filters 12 and 14 except the missmaching loss. When these first and second band stop filters 12 and 14 are constructed of micro striplines, the sum of the losses due to the first and second band stop filters 12 and 14 is considerably smaller than the losses due to a band pass filter which is interposed in the input line of the main transmission line of a conventional mixing circuit. Furthermore, because of the second band stop filter 14, and therefore because of the above-mentioned image frequency recovery effect, the output level of the intermediate frequency $f_{IF}$ is much higher than in case of a conventional mixing circuit.

The physical length of the main transmission line 20 between the first point 8P at which the band pass filter 8 is coupled to the main transmission line 20, and the output port 20-1 of the main transmission line 20, which port is connected to the input of the mixing diode 4, may be unrestrictedly determined in view of the effective wavelength. Therefore, when the value of the intermediate frequency $f_{IF}$ is set at a proper value, a single band stop filter may serve as both the first and second band stop filters 12 and 14. In other words, the first and second band stop filters 12 and 14 may be substituted with one band stop filter under predetermined conditions.

Figure 5:
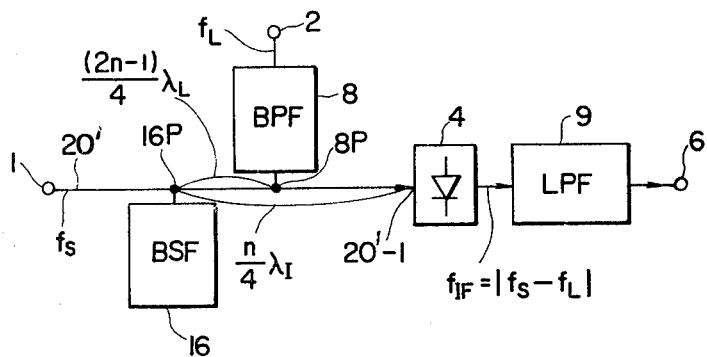
FIG. 5 shows a schematic block diagram of a second embodiment of the microwave mixing circuit according to the present invention.

Hence, reference is now made to FIG. 5 which shows a schematic block diagram of a second embodiment of the microwave mixing circuit according to the present invention. The second embodiment circuit is the same in construction except that a single band stop filter 16, in place of the first and second band stop filters 12 and 14 of the first embodiment, is electromagnetically coupled to the main transmission line 20' at a fourth point 16P between the input terminal 1 and the first point 8P. The same circuits and elements used in the first embodiment are designated by the like reference numerals. The function of the band stop filter 16 used in this second embodiment corresponds to those of the first and second band stop filters 12 and 14, and a detailed function of the second embodiment circuit will be further described hereinunder in connection with FIG. 6 which is a graph representing the attenuation factor of the band stop filter 16 with respect to various signals used in the second embodiment mixing circuit.

Figure 6:
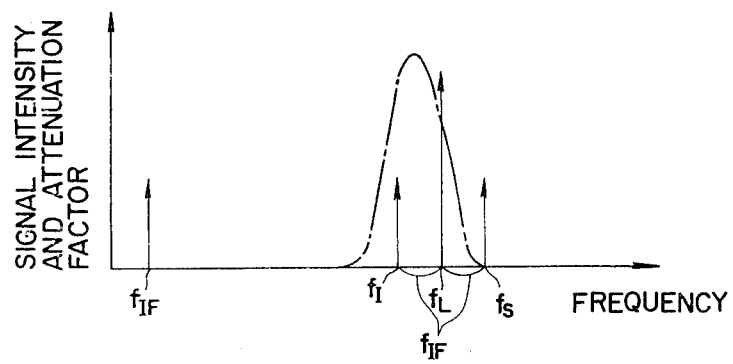
FIG. 6 is a graph showing the attenuation characteristic of the band stop filter used in the second embodiment with respect to frequencies.

It is assumed that the input high frequency $f_S$ is higher than the local oscillation frequency $f_L$ by the intermediate frequency $f_{IF}$ as shown in FIG. 6. Under this condition the image frequency $f_I$ is below the local oscillation frequency $f_L$ by the intermediate frequency $f_{IF}$. The band stop filter 16 has a frequency characteristic that the rejection band covers both the local oscillation frequency $f_L$ and the image frequency $f_I$ as shown in FIG. 6. The band stop filter 16 is coupled to the main transmission line 20' at such a location that the impedance at the local oscillation frequency $f_L$ viewed from the first point 8P toward the input port 1 is infinite, while the mixing diode 4 is connected to the output port 20'-1 of the main transmission line 20' in such a manner that the impedance at the image frequency $f_I$ viewed from the output port 20'-1 or the input of the mixing diode 4 is either infinite or zero.

With this arrangement, the band stop filter 16 functions to prevent the local oscillation frequency $f_L$ from being radiated from the input terminal 1, while the image frequency $f_I$ is efficiently used to increase the magnitude of the intermediate frequency $f_{IF}$ in the same manner as in the first embodiment mixing circuit. Although in the above it has been assumed that the input high frequency $f_S$ is higher than the local oscillation frequency $f_L$, this relationship may be reversed, while the same result is obtained.

Figure 9:
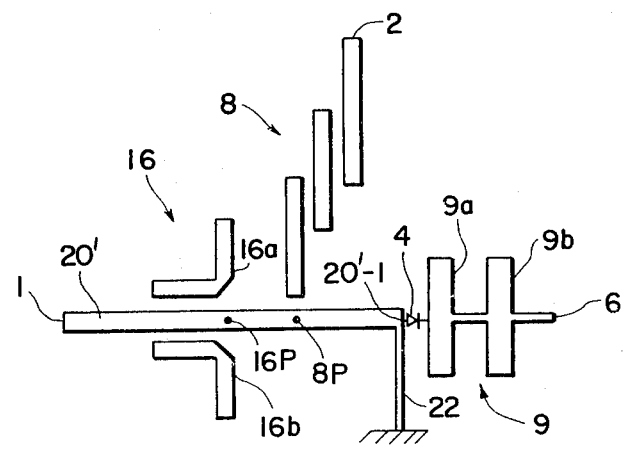
FIG. 9 shows a detailed arrangement of striplines corresponding to the second embodiment shown in FIG. 5.

In the above the basic idea of the mixing circuit according to the present invention has been described by way of schematic block diagrams of the first and second embodiments of the present invention. Hereinbelow two examples of mixing circuits which respectively correspond to the first and second embodiments shown in FIG. 4 and FIG. 5 will be described. These examples are shown in FIG. 7 and FIG. 9 in the form of detailed circuit diagrams of microwave integrated circuits (MIC) which are constructed of microwave striplines.

Figure 7:
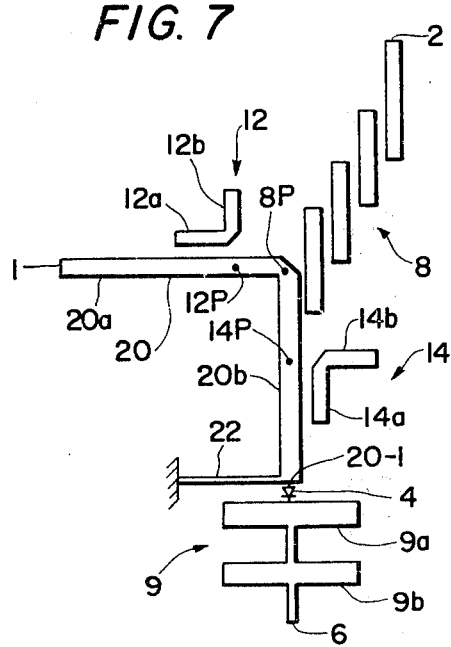
FIG. 7 shows a detailed arrangement of micro striplines corresponding to the first embodiment shown in FIG. 4.

FIG. 7 illustrates a detailed arrangement of micro striplines corresponding to the first embodiment shown in FIG. 4. The main transmission line 20, the band pass filter 8, the first and second band stop filters 12 and 14, and the low pass filter 9 are made of micro striplines. The main transmission line 20 has an input port 1 at one end and an output port 20-1 at the other end thereof. The main transmission line 20 has first and second portions 20a and 20b, and is so bent at the point 8P, which is located between the first and second portions 20a and 20b, that the main transmission line 20 has an L-shape. The band pass filter 8 comprises a plurality of striplines which constitute a half wave parallel coupled band pass filter. The micro striplines of the band pass filter 8, which are arranged in substantially parallel with each other, are normal to the first portion 20a of the main transmission line 20. The band pass filter 8 micro striplines are stepwisely arranged wherein one stripline positioned in the vicinity of the main transmission line 20 is arranged in parallel to the second portion 20b of the main transmission line 20 so that it functions as the output of the band pass filter 8 by electromagnetically coupling to the main transmission line at the first point 8P, and another stripline positioned at the other end functions as the second input terminal 2 for receiving the local oscillation frequency $f_L$.

The first band stop filter 12 has a frequency characteristic that it resonates at the local oscillation frequency $f_L$ and is located in the vicinity of the first portion 20a of the main transmission line 20, while the second band stop filter 14 has a frequency characteristic that it resonates at the image frequency $f_L$ and is located in the vicinity of the second portion 20b of the main transmission line 20. Therefore, the second and third points 12P and 14P, which are referred to as coupling points, are respectively located at the first and second portions 20a and 20b of the main transmission line 20. Each of the first and second band stop filters 12 and 14 has an L-shaped striplines which has first and second portions 12a, 14a, 12b and 14b. It will be understood that the word coupling point between the first band stop filter 12 and the main transmission line 20 is used in this specification to mean a zero impedance point.

The sum of the lengths of the first and second portions 12a and 12b of the first band stop filter 12 equals to half times the effective wavelength of the resonance frequency, i.e. the local oscillation frequency $f_L$, while the lengths of the first and second portions 12a and 12b are equal to each other. In other words, the length of the first portion 12a of the first band stop filter 12 corresponds with one fourth the wavelength of the local oscillation frequency $f_L$. This first portion 12a is arranged in parallel to the first portion 20a of the main transmission line 20 with a given space. Therefore, the first band stop filter 12 couples with the main transmission line 20 within an area defined by the length of the first portion 12a. Since the third point 14P also corresponds to a zero impedance point, these zero impedance points i.e. the second and third points 12P and 14P will be treated as the coupling points of the first and second band stop filters 12 and 14. The L-shaped stripline of the first band stop filter 12 is placed in a direction that the corner of the L-shaped stripline is in the first point 8P side. The second band stop filter 14 is arranged in a similar manner but the sum of the lengths of the first and second portions 14a and 14b equals to half of the effective wavelength of the image frequency $f_I$ to constitute a parallel-coupled filter. The L-shaped stripline of the second band stop filter 14 is provided in a direction that the corner thereof is in the first point 8P side. It will be understood that the length of the first portion 14a of the second band stop filter 14 equals to one fourth the effective wavelength of the image frequency $f_I$, while the third point 14P corresponds to a zero impedance point.

A stub filter 22 is connected between ground and the output port 20-1 of the main transmission line 20 in order to provide zero impedance at the intermediate frequency $f_{IF}$ at the high frequency input of the mixing diode 4, and to provide infinite impedance at the input high frequency $f_S$ and the local oscillation frequency $f_L$ so that the intermediate frequency $f_{IF}$ is readily and effectively drawn from the output of the mixing diode 4. The output of the mixing diode 4 is connected to an input of the low pass filter 9 which blocks frequencies higher than the intermediate frequency $f_{IF}$ band. The low pass filter 9 includes first and second T-shaped striplines 9a and 9b integrally formed and one end of the second T-shaped stripline 9b functions as the output terminal 6 of the mixing circuit.

The locations of the first and second band stop filters 12 and 14 will be determined in such a manner that the distance between the first point 8P at which the band pass filter 8 is coupled to the main transmission line 20, and the second point 12P at which the first band stop filter 12 is coupled to the main transmission line 20, corresponds to an effective wavelength expressed in terms of:

$$\frac{(2n-1)}{4} \lambda_L \qquad (1)$$

wherein "n" is a positive integer; and $\lambda_L$ is the effective wavelength of the local oscillation frequency $f_L$ on the main transmission line 20; and the distance between the first point 8P and the output port 20-1 to which the input of the mixing diode 4 is connected, corresponds to an effective wavelength expressed in terms of:

$$\frac{n}{4} \lambda_I \qquad (2)$$

wherein "n" is a positive interger; and $\lambda_I$ is the effective wavelength of the image frequency $f_I$ on the main transmission line 20.

From the above formulas it will be understood that the distance between the first and second points 8P and 12P may be:

$$\frac{1}{4}\lambda_L, \frac{3}{4}\lambda_L, \frac{5}{4}\lambda_L$$

while the distance between the third point 14 and the output port 20-1 may be:

$$\frac{1}{4}\lambda_I, \frac{2}{4}\lambda_I, \frac{3}{4}\lambda_I$$

It will be recognized that the impedance at the local oscillation frequency $f_L$ viewed from the first point 8P toward the input port 1 is always infinite when the distance (physical length) between the first and second points 8P and 12P equals to an effective wavelength defined by the first formula (1), while the impedance at the image frequency $f_I$ viewed from the output port 20-1 toward the first point 8P is either zero or infinite when the distance (physical length) between the third point 14P and the output port 20-1 equals to an effective wavelength defined by the second formula (2). The second formula (2) includes two possibilities which are respectively expressed by:

$$\frac{n}{2}\lambda_I \text{ and } \frac{(2n-1)}{4}\lambda_I$$

Accordingly, in the former case the impedance at the image frequency $f_I$ is zero, while in the latter case the impedance is infinite.

Once these distances are properly determined in this way, the oscillation frequency $f_L$ is reflected at the first point 8P to be directed toward the output port 20-1 so that the leakage of the power of the local oscillation frequency $f_L$ toward the input port 1 is negligible. This means that the power of the local oscillation frequency $f_L$ is efficiently applied to the mixing diode 4 while undesirable radiation of the same is prevented. Furthermore, the image frequency $f_I$ is reflected at the output port 20-1 or the input of the mixing diode 4 so that a high level intermediate frequency $f_{IF}$ will be derived from the mixing diode 4.

Figure 8:
FIG. 8 shows an example of a band stop filter which may be used in place of the band stop filter shown in FIG. 7.

Although in the above described embodiment parallelcoupled type band stop filters 12 and 14 are used as shown and described, other type of band stop filters may be used instead, if desired. FIG. 8 illustrates an example of a band stop filter coupled to a main transmission line 20. This band stop filter is constructed of an open ended stub 12' physically connected at one end thereof to the main transmission line 20, where the longitudinal length of the stub 12' is set to correspond to one fourth the resonance frequency.

FIG. 9 illustrates a detailed arrangement of micro striplines corresponding to the second embodiment mixing circuit shown in FIG. 5. The second embodiment circuit is somewhat similar to the first embodiment and thus the same circuits and elements are designated by like numerals. The main transmission line 20' is straight rather than being bent as in the first embodiment. This difference between the shapes of the main transmission lines 20 and 20' does not bring any substantial difference in function. In other words, the shape of the main transmission line 20 or 20' may be suitably determined at will.

The band pass filter 8 is constructed in the same manner as in the first embodiment and is coupled to the main transmission line 20' at the first point 8P meeting normally. The band stop filter 16 comprises two L-shaped striplines 16a and 16b which are arranged symmetrically with respect to the longitudinal direction of the main transmission line 20' so that the attenuation factor at the rejection band is made higher than in case of a single element, while bandwidth of the rejection band may be set wider. These striplines 16a and 16b are coupled to the main transmission line 20' at a zero impedance point 16P with respect to the resonance frequency. The distance between the first point 8P at which the band pass filter 8 is coupled to the main transmission line 20' and the zero impedance point 16P is so determined that it corresponds with:

$$\frac{(2n-1)}{4}\lambda_L$$

wherein "n" is a positive integer; and $\lambda_L$ is the effective wavelength of the local oscillation frequency $f_L$.

The distance between the zero impedance point and the output port 20'-1 of the main transmission line 20' will be determined in such a manner that it corresponds with:

$$\frac{n}{4}\lambda_I$$

wherein "n" is a positive integer; and $\lambda_I$ is the effective wavelength of the image frequency $f_I$ viewed from the input of the mixing diode 4.

Consequently, the impedance at the local oscillation frequency $f_L$ viewed from the first point 8P toward the input port 1 is infinite, while the impedance at the image frequency $f_I$ viewed from the input of the mixing diode 4 is either zero or infinite so that the second embodiment mixing circuit operates in the same manner as the first embodiment even though a single band stop filter 16 is employed.

What is claimed is:

1. A microwave mixing circuit constructed of a microwave integrated circuit, comprising:
   (a) a main transmission line having an input port at one end thereof for receiving an input high frequency, and an output port at an opposite end thereof;
   (b) a band pass filter responsive to a local oscillation frequency, said band pass filter having a parallel-coupled strip line filter which is electromagnetically coupled to said main transmission line at a point between said input and output ports;
   (c) a mixing diode having an input terminal connected to said output port for producing an intermediate frequency by mixing said local oscillation frequency, supplied to said diode in one direction along a portion of said main transmission line, with said input high frequency, supplied to said diode in the same direction along said main transmission line including said main line portion; and
   (d) a band stop filter for simultaneously blocking said local oscillation frequency and an image frequency, produced by said diode in response to said input high frequency and to said local oscillation frequency, said band stop filter being electromagnetically coupled to said main transmission line between said input port and said point in such a manner the the impedance at said local oscillation frequency viewed from said point toward said input port is infinite and that the impedance at said image frequency viewed from the input terminal of said mixing diode toward said point is either zero or infinite.

2. A microwave mixing circuit as claimed in claim 1, wherein the distance between a zero impedance point in a coupling area of said band stop filter and said point corresponds to:

$$\frac{(2n-1)}{4}\lambda_L$$

and wherein the distance between the zero impedance point and the input of said mixing diode corresponds to:

$$\frac{n}{4}\lambda_I$$

wherein "n" is a positive integer;
$\lambda_L$ is the effective wavelength of said local oscillation on said main transmission line; and
$\lambda_I$ is the effective wavelength of said image frequency on said main transmission line.

3. A microwave mixing circuit as claimed in claim 2 or 1, wherein said band stop filter comprises two L-shaped striplines which are arranged symmetrically with respect to the longitudinal direction of said main transmission line.

4. A microwave mixing circuit constructed of a microwave integrated circuit, comprising:
(a) a main transmission line having an input port at one end thereof for receiving an input high frequency, and an output port at an opposite end thereof;
(b) a band pass filter responsive to a local oscillation frequency, said band pass filter having a parallel-coupled strip line filter which is electromagnetically coupled to said main transmission line at a point between said input and output ports;
(c) a mixing diode having an input terminal connected to said output port for producing an intermediate frequency by mixing said local oscillation frequency, supplied to said diode in one direction along a portion of said main transmission line, with said input high frequency, supplied to said diode in the same direction along said main transmission line including said main line portion; and
(d) first means for blocking said local oscillation frequency, said first means being electromagnetically coupled to said main transmission line in such a manner that the impedance at said local oscillation frequency viewed from said point toward said input port is infinite; and
(e) second means for blocking an image frequency produced by said diode in response to said input high frequency and to said local oscillation frequency, said second means being electromagnetically coupled to said main transmission line in such a manner that the impedance at said image frequency viewed from the input terminal of said mixing diode toward said point is either zero or infinite.

5. A microwave mixing circuit as claimed in claim 4, wherein said first and second means respectively comprise first and second band stop filters, said first band stop filter being coupled to said main transmission line between said input port and said point, said second band stop filter being coupled to said main transmission line between said point and said output port.

6. A microwave mixing circuit as claimed in claim 2, wherein the distance between a zero impedance point in a coupling area of said first band stop filter, and said first point corresponds to:

$$\frac{(2n-1)}{4}\lambda_L$$

wherein "n" is a positive integer and $\lambda_L$ is the effective wavelength of said local oscillation frequency on said main transmission line.

7. A microwave mixing circuit as claimed in claim 2, wherein the distance between a zero impedance point in a coupling area of said second band stop filter, and the input of said mixing diode corresponds to:

$$\frac{n}{4}\lambda_I$$

wherein "n" is a positive integer and $_I$ is the effective wavelength of said image frequency on said main transmission line.

8. A microwave mixing circuit as claimed in claim 4, further comprising a low pass filter connected to said mixing diode.

9. A microwave mixing circuit as claimed in claim 4, further comprising a stub filter interposed between said output port and ground.

10. A microwave mixing circuit as claimed in claim 5 or 1, wherein said band stop filter comprises a parallel-coupled stripline filter.

11. A microwave mixing circuit as claimed in claim 5 or 1, wherein said band stop filter comprises an L-shaped stripline arranged in the vicinity of said main transmission line.

12. A microwave mixing circuit as claimed in claim 5 or 1, wherein said band stop filter comprises a stub physically connected to said main transmission line.

* * * * *